(12) United States Patent
Jung et al.

(10) Patent No.: US 9,224,978 B2
(45) Date of Patent: Dec. 29, 2015

(54) ORGANIC LIGHT EMITTING DIODE DISPLAY DEVICE

(75) Inventors: Woo-Suk Jung, Yongin (KR); Soon-Ryong Park, Yongin (KR); Duk-Jin Lee, Yongin (KR); Sa-Bang Um, Yongin (KR); Jae-Yong Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 338 days.

(21) Appl. No.: 12/873,003

(22) Filed: Aug. 31, 2010

(65) Prior Publication Data

US 2011/0127498 A1 Jun. 2, 2011

(30) Foreign Application Priority Data

Dec. 1, 2009 (KR) ........................ 10-2009-0117927

(51) Int. Cl.
*H01L 51/50* (2006.01)
*H01L 51/52* (2006.01)

(52) U.S. Cl.
CPC .................................. *H01L 51/5237* (2013.01)

(58) Field of Classification Search
None
See application file for complete search history.

(56) References Cited

U.S. PATENT DOCUMENTS

| 4,430,183 | A | 2/1984 | Schuller et al. |
| 6,670,772 | B1 | 12/2003 | Arnold et al. |
| 2003/0030369 | A1* | 2/2003 | Shih et al. ...................... 313/504 |
| 2004/0021415 | A1* | 2/2004 | Vong et al. ..................... 313/509 |
| 2007/0164673 | A1* | 7/2007 | Hu ................. 313/512 |
| 2007/0205719 | A1* | 9/2007 | Kim ............... 313/512 |
| 2009/0126791 | A1* | 5/2009 | Lu et al. ........................ 136/258 |
| 2010/0019667 | A1 | 1/2010 | Park et al. |
| 2010/0118530 | A1* | 5/2010 | Nagai ........................... 362/235 |

FOREIGN PATENT DOCUMENTS

| JP | 2002033186 A | 1/2002 |
| JP | 2004310053 A | 11/2004 |
| JP | 2006004721 A | 1/2006 |
| JP | 2006164937 A | 6/2006 |
| JP | 2006222070 A | 8/2006 |
| JP | 2006222071 A | 8/2006 |
| JP | 2008243379 A | 10/2008 |
| KR | 10-2005-0107048 | 11/2005 |
| KR | 1020060099743 A | 9/2006 |
| KR | 10-2007-0047863 | 5/2007 |
| KR | 10-2007-0083110 | 8/2007 |

(Continued)

OTHER PUBLICATIONS

Greene et al. Surface and Interface Analysis, 1981, 3 (1), p. 34.*

(Continued)

*Primary Examiner* — J. L. Yang
(74) *Attorney, Agent, or Firm* — Robert E. Bushnell, Esq.

(57) ABSTRACT

An organic light emitting diode (OLED) display device includes a first substrate; a first electrode positioned on the first substrate; an organic light emission layer positioned on the first electrode; a second electrode positioned on the organic light emission layer; and a capping layer positioned on the second electrode to cover the organic light emission layer and including an ultraviolet (UV) interception material intercepting UV rays irradiated to the organic light emission layer from the exterior.

7 Claims, 4 Drawing Sheets

(56) References Cited

FOREIGN PATENT DOCUMENTS

| KR | 1020090090912 A | | 8/2009 | | |
|----|-----------------|---|--------|---|---|
| WO | 03069957 A1 | | 8/2003 | | |
| WO | WO 2008/047851 A1 | * | 4/2008 | ............ | H01L 25/075 |

OTHER PUBLICATIONS

Abstract of Greene et al., Semiconductor crystal growth by sputter deposition, Surface and Interface Analysis, vol. 3, Issue 1, pp. 34-54, Feb. 1981 (published online on Sep. 15, 2004).

* cited by examiner

ORGANIC LIGHT EMITTING DIODE DISPLAY DEVICE

CLAIM OF PRIORITY

This application makes reference to, incorporates the same herein, and claims all benefits accruing under 35 U.S.C. §119 from an application earlier filed in the Korean intellectual property Office on 1 Dec. 2009 and there duly assigned Serial No. 10-2009-0117927.

BACKGROUND OF THE INVENTION

1. Field of the Invention

The described technology relates generally to an organic light emitting diode (OLED) display device and, more particularly, to an OLED display device having a capping layer.

2. Description of the Related Art

Recently, organic light emitting diode (OLED) display devices have received much attention as display devices for displaying images.

An OLED display device has self-emission characteristics, eliminating the necessity of a separate light source, unlike a liquid crystal display (LCD) device, such that the OLED display device may be fabricated to be thinner and lighter. Also, the OLED display device has high quality characteristics such as low power consumption, high luminance, a high response speed, and the like. The material constituting an organic light emission layer of the OLED display device is however vulnerable to ultraviolet (UV) rays and moisture.

The above information disclosed in this Background section is only for enhancement of understanding of the background of the described technology and therefore it may contain information that does not form the prior art that is already known in this country to a person of ordinary skill in the art.

SUMMARY OF THE INVENTION

It is therefore an object for the present invention to provide an improved organic light emitting diode (OLED) display device protecting an organic light emission layer against ultraviolet (UV) rays and moisture.

An exemplary embodiment of the present invention provides an OLED display device including a first substrate; a first electrode positioned on the first substrate; an organic light emission layer positioned on the first electrode; a second electrode positioned on the organic light emission layer; and a capping layer positioned on the second electrode to cover the organic light emission layer and including an ultraviolet (UV) interception material intercepting UV rays irradiated to the organic light emission layer from the exterior of the OLED display device.

The UV interception material may include one or more of zinc oxide, titanium oxide, iron oxide, and magnesium oxide.

The capping layer may be an amorphous organic film or an amorphous inorganic film.

The capping layer may include one or more of a-NPD, NPB, TPD, m-MTDATA, Alq3, LiF, and CuPc.

The capping layer may be an inorganic film including silicon (Si).

The capping layer may be deposited by the atom or by the molecule.

The capping layer may further include a UV interception layer including a UV interception material.

The UV interception layer may be separated from the second electrode.

In accordance with an exemplary embodiment of the present invention, because the organic light emission layer of the OLED display device is protected against UV and moisture, the life span of the OLED display device may be lengthened.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
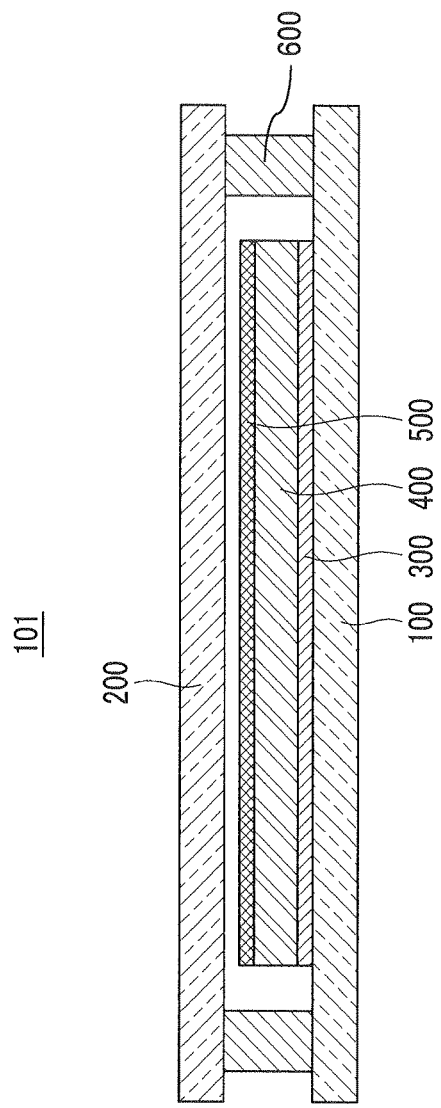
FIG. 1 is a cross-sectional view of an organic light emitting diode (OLED) display device constructed as a first exemplary embodiment of the present invention.

The exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention.

In describing the exemplary embodiments, the same reference numerals are used for elements having the same constructions and that are representatively described in a first exemplary embodiment, and in remaining exemplary embodiments, different configurations from those of the first exemplary embodiment will be described.

In order to clarify the exemplary embodiments, parts that are not connected with the description will be omitted, and the same elements or equivalents are referred to by the same reference numerals throughout the specification.

The size and thickness of each element are arbitrarily shown in the drawings, and the exemplary embodiment is not limited thereto.

In the drawings, the thickness of layers, films, panels, regions, etc., are exaggerated for clarity. Also, in the drawings, the thickness of some layers and regions are exaggerated for the sake of brevity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In general, the OLED display device includes an organic light emitting element that emits light. The organic light emitting element includes an organic light emission layer, and first and second electrodes with the organic light emission layer interposed therebetween. The organic light emission layer of the organic light emitting element may be formed of low molecular organic materials.

The material constituting the organic light emission layer is however physically vulnerable to ultraviolet (UV) rays and moisture.

The above information disclosed is only for enhancement of understanding of the background of the described technology and therefore it may contain information that does not form the prior art that is already known in this country to a person of ordinary skill in the art.

In the accompanying drawings, an active matrix (AM) type of OLED display device with a 2Tr–1 Cap structure in which a single pixel has two thin film transistors (TFTs) and one storage capacitor is illustrated, but the exemplary embodiment is not meant to be limited thereto. That is, in the OLED display device, a single pixel may have three or more TFTs and two or more storage capacitors, and the OLED display device may have various other structures with more wiring. Here, a pixel refers to a minimum unit for displaying an image, and the OLED display device displays an image through a plurality of pixels.

An OLED display device 101 constructed as a first exemplary embodiment will now be described with reference to FIGS. 1 through 4.

FIG. 1 is a cross-sectional view of the OLED display device constructed as a first exemplary embodiment.

As shown in FIG. 1, the OLED display device 101 constructed as the first exemplary embodiment includes a first substrate 100, a second substrate 200, a wiring unit 300, an organic light emitting element 400, and a capping layer 500.

The first and second substrates 100 and 200 are insulating substrates which may be formed of glass, polymer, stainless steel, or the like, and at least one of the first and second substrates 100 and 200 is made of a light-transmissive material. The wiring unit 300 and the organic light emitting element 400 are positioned on the first substrate 100, and the second substrate 200 faces toward the first substrate 100 with the wiring unit 300 and the organic light emitting element 400 interposed therebetween. The first and second substrates 100 and 200 are attached and hermetically sealed by a sealant 600 with the organic light emitting element 400 interposed therebetween, and protect the wiring unit 300 and the organic light emitting element 400 against external interference.

The wiring unit 300 includes switching and driving thin film transistors (TFTs) 10 and 20 (See FIG. 2), and transfers a signal to the organic light emitting element 400 in order to drive the organic light emitting element 400. The organic light emitting element 400 emits light in accordance with the signal received from the wiring unit 300.

The organic light emitting element 400 is positioned on the wiring unit 300. The organic light emitting element 400 may be in direct contact with the wiring unit 300.

The organic light emitting element 400 is positioned on a display area of the first substrate 100, and is formed by using microelectromechanical systems (MEMS) such as photolithography. The organic light emitting element 400 receives a signal from the wiring unit 300 and displays an image in accordance with the received signal. The capping layer 500 is positioned on the organic light emitting element 400. The capping layer 500 may be in direct contact with the organic light emitting element 400.

The capping layer 500, covering the organic light emitting element 400, restrains (or suppresses) moisture from being introduced into an organic light emission layer 720 (shown in FIG. 3) included in the organic light emitting element 400 (to be described), and intercepts UV rays irradiated to the capping layer 500 to restrain UV rays from being irradiated to the organic light emission layer 720 via the capping layer 500. The capping layer 500 may cover the entirety of the organic light emitting element 400.

An internal structure of the OLED display device 101 constructed as the first exemplary embodiment will now be described with reference to FIGS. 2 and 3.

Figure 2:
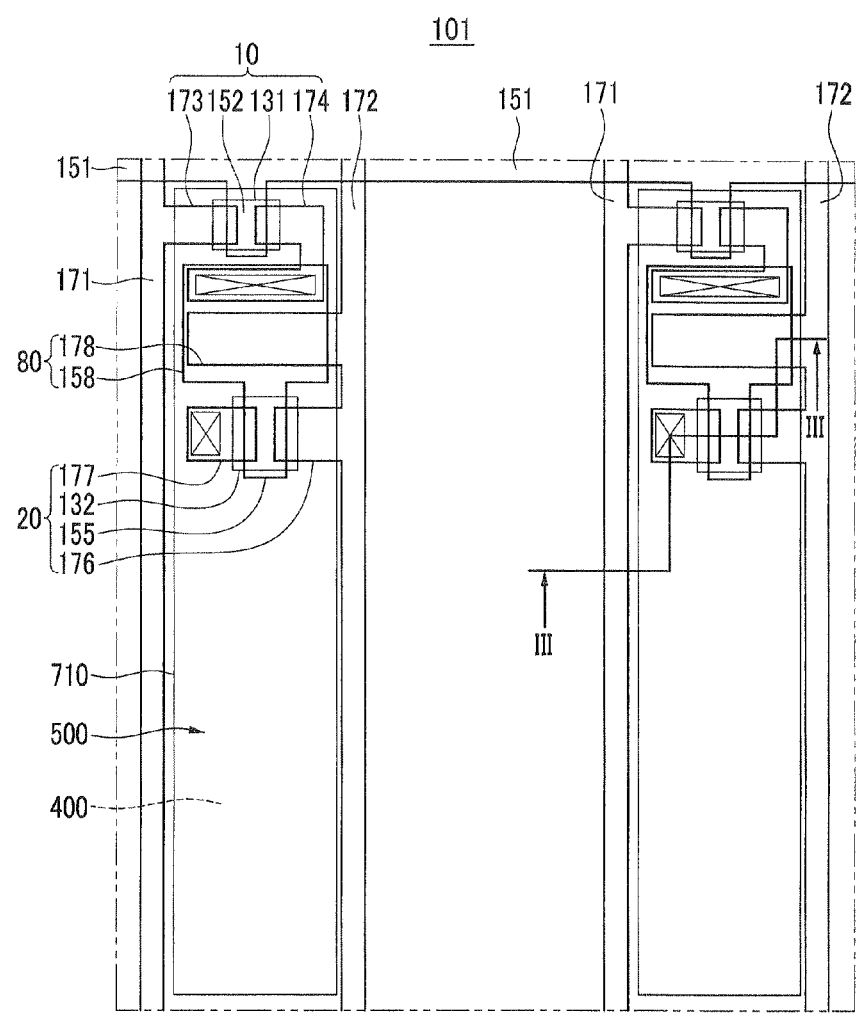
FIG. 2 is a layout view showing the structure of pixels of the OLED display device constructed as the first exemplary embodiment of the present invention.

FIG. 2 is a layout view showing the structure of pixels of the OLED display device as the first exemplary embodiment. FIG. 3 is a cross-sectional view taken along line in FIG. 2.

Figure 3:
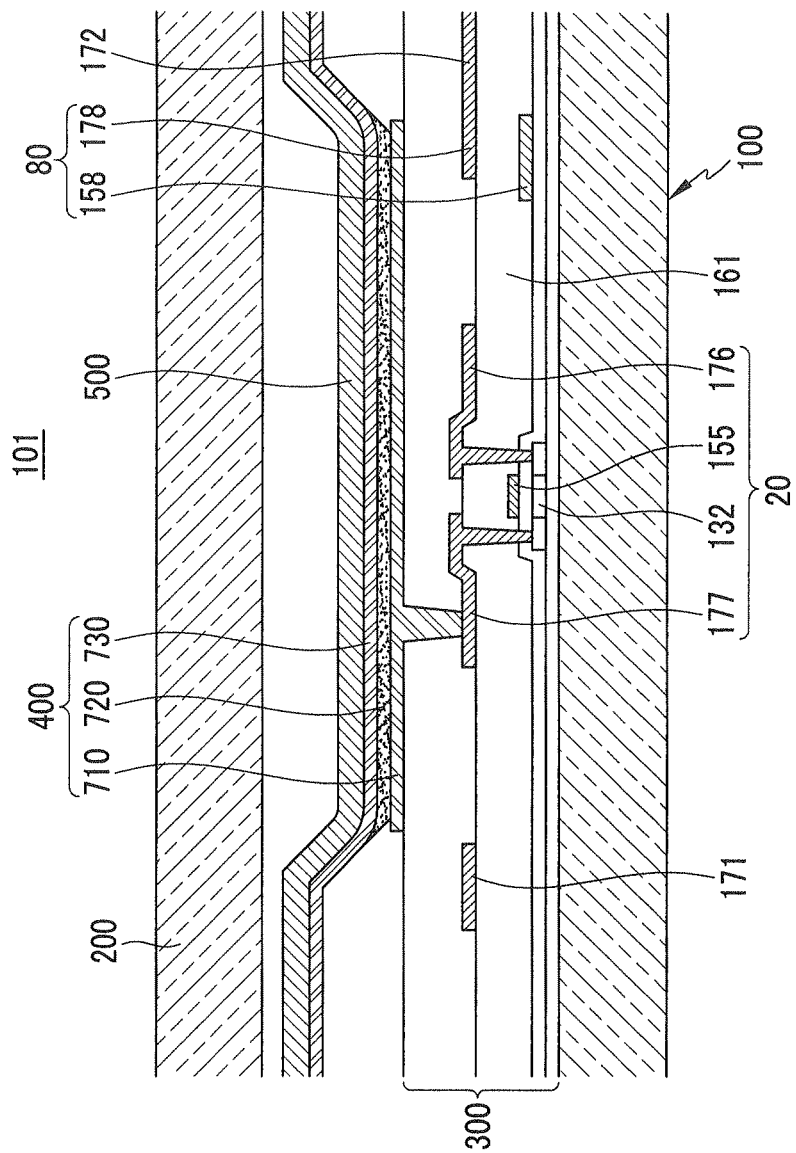
FIG. 3 is a cross-sectional view taken along line III-III in FIG. 2.

The structure of the wiring unit 300 and the organic light emitting element 400 are illustrated in FIGS. 2 and 3, but the exemplary embodiment is not limited thereto. The wiring unit 300 and the organic light emitting element 400 may be formed to have various structures within the scope in which the skilled person in the art can easily modify and implement them. For example, in the accompanying drawings, an active matrix (AM) type of OLED display device with a 2Tr–1Cap structure in which a single pixel has two TFTs and one storage capacitor is illustrated, but the exemplary embodiment is not meant to be limited thereto. That is, the number of TFTs, the number of storage capacitors, and the number of wires of the display device are not limited. A pixel is a minimum unit for displaying an image, and the OLED display device displays an image through a plurality of pixels.

As shown in FIGS. 2 and 3, the OLED display device 101 includes a switching TFT 10, a driving TFT 20, a storage capacitor 80, and the organic light emitting element 400 formed at each pixel. Here, the configuration including the switching TFT 10, the driving TFT 20, and the storage capacitor 80 is called the wiring unit 300. The wiring unit 300 further includes a gate line 151 disposed along one direction of the first substrate 100, a data line 171 electrically insulated from the gate line 151 and crossing the gate line 151, and a common power line 172. Here, one pixel may be defined by the gate line 151, the data line 171, and the common power line 172 as boundaries, but is not limited thereto.

The organic light emitting element 400 includes a first electrode 710, the organic light emission layer 720 formed on the first electrode, and a second electrode 730 formed on the organic light emission layer 720. The first electrode 710, the organic light emission layer 720, and the second electrode 730 constitute the organic light emitting element 400. Here, the first electrode 710 is an anode, which is a hole injection electrode, and the second electrode 730 is a cathode, which is an electron injection electrode. The first exemplary embodiment is however not limited thereto, and the first electrode 710 may be a cathode and the second electrode 730 may be an anode depending on a driving method of the OLED display device.

Holes and electrons from the first and second electrodes 710 and 730 are injected into the organic light emission layer 720, and when exitons formed as the holes and electrodes injected into the organic light emission layer 720 are combined change from an excited state to a base state, the organic light emission layer 720 emits light.

Also, in the OLED display device 101 constructed as the first exemplary embodiment, the first electrode 710 may be made of a light reflective material such as aluminum (Al), and the second electrode 730 may be made of a light transmissive material including indium tin oxide (ITO), indium zinc oxide (IZO), or the like, which is transparent or translucent. The exemplary embodiment is however not limited thereto, and one or more of the first and second electrodes 710 and 730 may be made of a transparent or translucent conductive material.

Also, in the OLED display device 101 constructed as the first exemplary embodiment, the organic light emitting element 400 emits light toward the second substrate 200. The exemplary embodiment is however not limited thereto, and light emitted from the organic light emitting element 400 may proceed toward one or more of the first and second substrates 100 and 200. That is, the OLED display device 101 constructed as the first exemplary embodiment is a top emission type of OLED display device, but an OLED display device constructed as a different exemplary embodiment may be a bottom emission type of OLED display device or a dual-emission type of OLED display device.

The storage capacitor 80 includes a pair of capacitor plates 158 and 178 disposed with an interlayer insulating layer 161 interposed therebetween. Here, the interlayer insulating layer 161 serves as a dielectric material, and capacitance of the storage capacitor 80 is determined by electric charges charged in the storage capacitor 80 and the voltage between the two capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switching element for selecting pixels to be illuminated. The switching gate electrode 152 is connected with the gate line 151. The switching source electrode 173 is connected with the data line 171. The switching drain electrode 174 is disposed to be separated from the switching source electrode 173, and is connected with one capacitor plate 158.

The driving TFT 20 applies driving power for making the organic light emission layer 720 of the organic light emitting element 400 within a selected pixel emit light to the first electrode 710. The driving gate electrode 155 is connected with the capacitor plate 158 connected with the switching drain electrode 174. The driving source electrode 176 and another capacitor plate 178 are connected with the common power line 172, respectively. The driving drain electrode 177 is connected with the first electrode 710 of the organic light emitting element 400 via a contact hole.

With such a structure, the switching TFT 10 operates by a gate voltage applied to the gate line 151 to transfer a data voltage applied to the data line 171 to the driving TFT 20. The voltage difference between a common voltage applied from the common power line 172 to the driving TFT 20 and the data voltage transferred from the switching TFT 10 is stored in the storage capacitor 80, and the current corresponding to the voltage stored in the storage capacitor 80 flows to the organic light emitting element 400 via the driving TFT 20, making the organic light emitting element 400 emit light.

The capping layer 500 formed on the second electrode 730 covers the organic light emitting element 400 including the organic light emission layer 720. The capping layer 500 may cover the entirety of the organic light emitting element 400 including the organic light emission layer 720, the second electrode 730 and the first electrode 710.

The capping layer 500 includes a UV interception material. The UV interception material includes one or more of zinc oxide (ZnO), titanium oxide ($TiO_2$), iron oxide ($Fe_2O_3$), and magnesium oxide (MgO). The capping layer 500 including the UV interception material intercepts UV rays irradiated to the capping layer 500 from the exterior via the second substrate 200. Because UV rays irradiated toward the capping layer 500 via the second substrate 200 from the exterior are intercepted, UV irradiation from the exterior to the organic light emission layer 720 covered by the capping layer 500 can be restrained. Namely, the life span of the organic light emission layer 720 covered by the capping layer 500 may be increased because of the UV interception function of the capping layer 500.

The capping layer 500 may be formed as an amorphous organic film or an amorphous inorganic film.

In detail, the capping layer 500 may be formed as an amorphous organic film by depositing one or more of a-NPD, NPB, TPD, m-MTDATA, Alq3, LiF, and CuPc and the above-mentioned UV interception material by the atom or by the molecule.

The capping layer 500 may be formed as an amorphous inorganic film by depositing a compound containing silicon (Si) such as silicon nitride (SiNx), silicon oxide (SiOx), silicon oxide/nitride (SiOxNy), and the like, and the above-mentioned UV interception material by the atom or by the molecule.

Because the capping layer 500 is formed to be amorphous, the capping layer 500 may be maintained to be transparent. That is, because the capping layer 500 is formed in the amorphous state, light emitted from the organic light emission layer 720 may be irradiated to the exterior via the capping layer 500 and the second substrate 200 without a large loss of light emitted, so as to be implemented as an image.

Also, the capping layer 500 may be formed as the amorphous organic film or the amorphous inorganic film, and the molecules or atoms included in the capping layer 500 form a dense structure. Because the capping layer 500 itself has a dense structure, moisture that can be introduced from the external environment into the organic light emission layer 720 of the organic light emitting element 400 from the exterior may be fundamentally intercepted.

In addition, because the capping layer 500 is positioned on the organic light emitting element 400 and covers the organic light emitting element 400, the capping layer 500 may protect the organic light emitting element 400 against external interference. In this manner, because the capping layer 500 protects the organic light emitting element 400, the space between the first and second substrates 100 and 200 may be minimized, and accordingly, the overall thickness of the OLED display device 101 may become thinner.

Also, because the capping layer 500 may be positioned on the second electrode 730 of the organic light emitting element 400, reflection of external light by the second electrode 730 may be restrained. Thus, because reflection of external light by the organic light emitting element 400 is restrained because of the capping layer 500, an element such as an optical film generally formed on the second substrate 200 to restrain reflection of external light may be omitted. Thus, because such an element as the optical film generally positioned on the second substrate 200 may be omitted by virtue of the capping layer 500, luminous efficiency of the OLED display device 101 can be improved. Here, the capping layer 500 may be in direct contact with the second electrode 730 of the organic light emitting element 400.

As described above, because the OLED display device 101 constructed as the first exemplary embodiment includes the capping layer 500 including the UV interception material, damage to the organic light emission layer 720 due to UV rays and moisture may be restrained, resulting in the lengthened lifespan of the OLED display device 101.

Meanwhile, in a case where a window-integrated OLED display device is manufactured by attaching a window protecting the OLED display device 101 on the second substrate 200, a UV thermosetting adhesive resin (not shown) is formed between the window and the second substrate 200, the window is bonded to the second substrate 200 by using the UV thermosetting adhesive resin, and the UV thermosetting adhesive resin is then hardened by using UV rays. During the manufacture of the window-integrated OLED display device, the UV interception material included in the capping layer 500 of the OLED display device constructed as the first exemplary embodiment intercepts UV rays, which are the means for hardening the UV thermosetting adhesive resin, so damage to the organic light emission layer 720 by UV rays may be restrained.

An OLED display device 102 constructed as a second exemplary embodiment will now be described with reference to FIG. 4.

Figure 4:
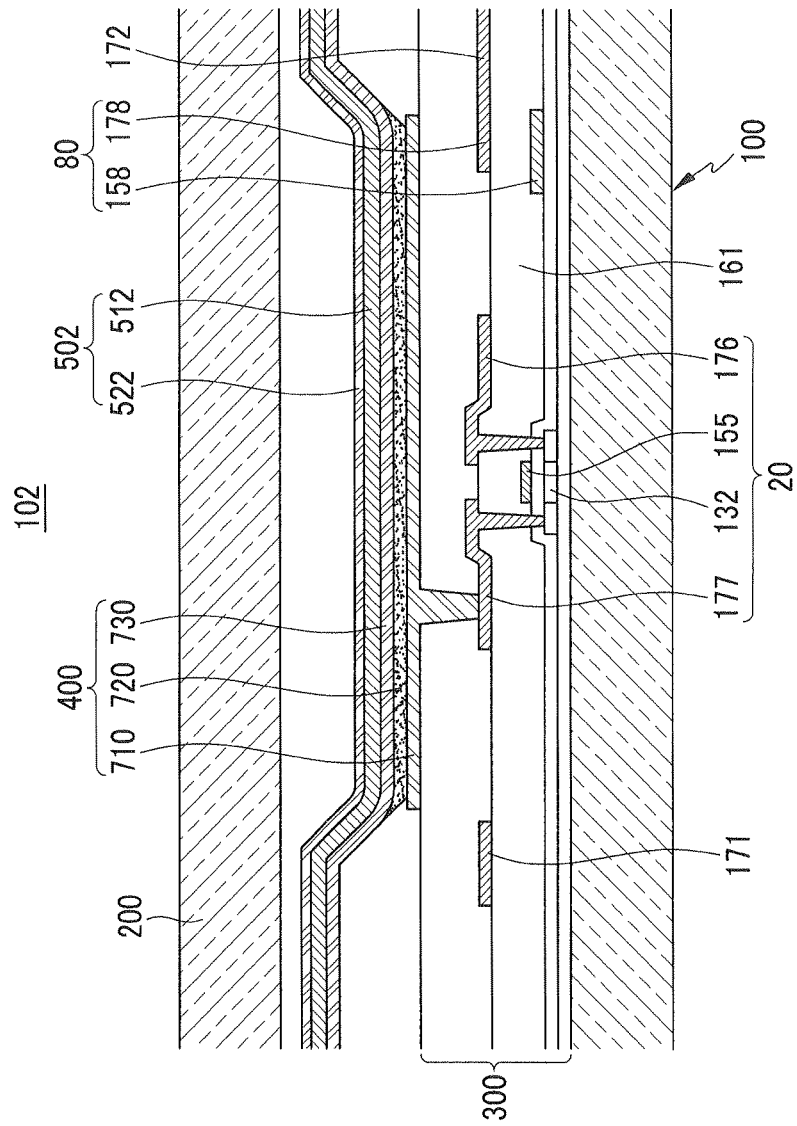
FIG. 4 is a cross-sectional view showing a major part of the OLED display device constructed as a second exemplary embodiment of the present invention.

FIG. 4 is a cross-sectional view showing a major part of the OLED display device constructed as a second exemplary embodiment.

As shown in FIG. 4, a capping layer 502 of the OLED display device 102 constructed as the second exemplary embodiment is a multiple layer and includes a base layer 512 and a UV interception layer 522. The base layer 512 and the UV interception layer 522 are different from each other and are separately disposed from each other.

The base layer 512 is formed on the second electrode 730 to cover the organic light emitting element 400 including the organic light emission layer 720. The base layer 512 is formed as an amorphous organic film or as an amorphous inorganic film. In detail, the base layer 512 is formed as an amorphous organic film by depositing one or more of a-NPD, NPB, TPD, m-MTDATA, Alq3, LiF, and CuPc by the atom or by the molecule, or is formed as an amorphous inorganic film by depositing a compound containing silicon (Si) such as silicon nitride (SiNx), silicon oxide (SiOx), silicon oxide/nitride (SiOxNy), and the like, by the atom or by the molecule. Because the base layer 512 is formed to be amorphous, the base layer 512 may be maintained to be transparent. That is, because the base layer 512 is formed to be in the amorphous state, light emitted from the organic light emission layer 720 can be irradiated to the exterior via the base layer 512 and the second substrate 200 without a large loss, so as to be implemented as an image.

The UV interception layer 522 is positioned on the base layer 512.

The UV interception layer 522 formed on the base layer 512 may cover the base layer 512 covering the organic light emission layer 720. The UV interception layer 522 formed on the base layer 512 may cover the entirety of the base layer 512. The UV interception layer 522 includes a UV interception material. The UV interception material includes one or more of zinc oxide (ZnO), titanium oxide ($TiO_2$), iron oxide ($Fe_2O_3$), and magnesium oxide (MgO). In other words, the UV interception material may be one of zinc oxide (ZnO), titanium oxide ($TiO_2$), iron oxide ($Fe_2O_3$), and magnesium oxide (MgO), and may be a mixture of the above material. The UV interception layer 522 including the UV interception material intercepts UV irradiated to the UV interception layer 522 from the exterior via the second substrate 200. Because UV rays irradiated to the UV interception layer 522 via the second substrate 200 from the exterior are intercepted, UV irradiation from the exterior to the organic light emission layer 720 covered by the UV interception layer 522 may be restrained. That is, the life span of the organic light emission layer 720 covered by the capping layer 502 may be increased because of the UV interception function of the UV interception layer 522.

Also, because the UV interception layer 522 is formed as the amorphous thin film by depositing the above-mentioned UV interception material by the atom or by the molecule, the capping layer 520 including the UV interception layer 522 can be maintained to be transparent. That is, because the capping layer 502 is formed to be in the amorphous state, light emitted from the organic light emission layer 720 may be irradiated to the exterior via the capping layer 502 and the second substrate 200 without a large loss of light emitted, so as to be implemented as an image.

The UV interception layer 522 is disposed spaced-apart from the second electrode 730 with the base layer 512 interposed between the UV interception layer 522 and the second electrode 730. The UV interception layer 522 absorbs UV rays and prevents the organic light emission layer 720 to be irradiated by the UV rays, and in this case, the temperature of the UV interception layer 522 itself may increase due to the UV absorption. Even though the temperature of the UV interception layer 522 goes up as a result UV absorption, because the UV interception layer 522 is disposed spaced-apart from the second electrode 730, an increase in the temperature of the second electrode 730 may be restrained according to thermal conduction over the increase in the temperature of the UV interception layer 522 itself. In other words, the thermal conductivity between the second electrode 730 and the UV interception layer 522 decreases because of the interposed base layer 512. Namely, because the UV interception layer 522 absorbs UV a in a state of being separated from the second electrode 730, an increase in the temperature of the second electrode 730 resulting from the increase in the temperature of the UV interception layer 522 can be restrained, and thus, degradation of the second electrode 730 can be restrained.

As described above, because the OLED display device 102 constructed as the second exemplary embodiment includes the capping layer 520 having the UV interception layer 522 with a UV interception material, damage to the organic light emission layer 720 due to UV a and moisture and degradation of the second electrode 730 due to an increase in the temperature may be restrained, and thus, the lifespan of the OLED display device 102 may be increased.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
a first substrate;
a second substrate disposed spaced apart from and opposite to the first substrate;
a first electrode positioned on the first substrate;
an organic light emission layer positioned on the first electrode;
a second electrode positioned on the organic light emission layer; and
an entirely amorphous capping layer positioned on the second electrode to cover the organic light emission layer, said capping layer comprising an ultraviolet (UV) interception material intercepting UV rays irradiated to the organic light emission layer from an exterior of the OLED display device,
wherein the capping layer is deposited by the atom or by the molecule, and the capping layer comprises one or more of a-NPD, NPB, TPD, m-MTDATA, Alq3, or CuPc.

2. The OLED display device of claim 1, wherein the UV interception material comprises one or more of zinc oxide, titanium oxide, iron oxide, or magnesium oxide.

3. The OLED display device of claim 1, wherein the capping layer further comprises a UV interception layer comprising a UV interception material.

4. The OLED display device of claim 3, wherein the UV interception layer is separated from the second electrode.

5. An organic light emitting diode (OLED) display device, comprising:
- a first substrate;
- a second substrate disposed spaced apart from and opposite to the first substrate;
- an organic light emitting element disposed on the first substrate, the organic light emitting element comprising a first electrode, a second electrode and an organic light emission layer interposed between the first and second electrodes; and
- an entirely amorphous capping layer covering the entirety of an upper surface of the organic light emitting element, and the capping layer intercepting ultraviolet (UV) rays irradiated to the organic light emission layer from an exterior of the OLED display device,
- wherein the capping layer is deposited by the atom or by the molecule,
- wherein the capping layer comprises an amorphous base layer and an amorphous UV interception layer different from the amorphous base layer, the amorphous base layer is disposed directly on the second electrode, the amorphous UV interception layer is disposed directly on the amorphous base layer, the amorphous base layer comprises at least one of silicon compound, a-NPD, NPB, TPD, m-MTDATA, Alq3, LiF, or CuPc, the amorphous UV interception layer comprises at least one of zinc oxide, titanium oxide, iron oxide, or magnesium oxide.

6. The OLED display device of claim 5, wherein the capping layer is an amorphous inorganic film comprising silicon (Si).

7. The OLED display device of claim 5, wherein the UV interception layer is disposed spaced-apart from the second electrode.

* * * * *